United States Patent [19]

Cleary, Jr. et al.

[11] Patent Number: 4,841,200
[45] Date of Patent: Jun. 20, 1989

[54] CIRCUIT FOR DRIVING A MULTIPLE-ELEMENT DISPLAY

[75] Inventors: Edward J. Cleary, Jr.; Mike R. Coleman, both of Beaverton, Oreg.; Michael R. Jones, Brea, Calif.

[73] Assignee: Tektronix, Inc., Beaverton, Oreg.

[21] Appl. No.: 106,995

[22] Filed: Oct. 5, 1987

Related U.S. Application Data

[63] Continuation of Ser. No. 850,198, Apr. 10, 1986, abandoned.

[51] Int. Cl.$^4$ ............................................. H05B 37/00
[52] U.S. Cl. .................................. 315/363; 315/169.1; 315/169.3; 340/771; 340/782
[58] Field of Search ............... 315/169.1, 169.2, 169.3, 315/169.4, 363; 340/771, 752, 772, 776, 778, 782; 324/99 D, 96, 122, 132

[56] References Cited

U.S. PATENT DOCUMENTS

| | | | |
|---|---|---|---|
| 3,824,588 | 7/1974 | Vermillion | 324/99 D |
| 4,008,968 | 2/1977 | Imhoff et al. | 340/347 |
| 4,081,745 | 3/1978 | Yasunaga | 324/99 R |
| 4,161,651 | 7/1979 | Sano et al. | 324/96 |
| 4,178,593 | 12/1979 | Kishino et al. | 340/772 |
| 4,325,024 | 4/1982 | Heidenreich et al. | 324/99 D |
| 4,412,213 | 10/1983 | Nishino et al. | 340/772 |
| 4,429,256 | 1/1984 | Ngo | 315/169.4 |
| 4,462,026 | 7/1984 | Munday | 340/772 |
| 4,567,429 | 1/1986 | Livsey | 324/99 D |
| 4,591,847 | 5/1986 | Criscimagna et al. | 315/169.4 |
| 4,637,047 | 1/1987 | Haino | 324/96 |

*Primary Examiner*—Leo H. Boudreau
*Assistant Examiner*—Michael Razavi
*Attorney, Agent, or Firm*—Francis I. Gray; John Smith-Hill

[57] ABSTRACT

A circuit for driving a display device having n display elements, where n is a positive integer greater than one, comprises a device for poviding a repetitive digital signal having a predetermined sequence of n digital values. The digital signal is converted to analog form in accordance with a predetermined transfer function and the resulting analog signal is compared with a second signal. A display enable signal is generated in the event that the magnitude of the analog signal bears a predetermined relationship to the magnitude of the second signal. A decoder circuit has a plurality of output terminals at which n distinct output signals, corresponding respectively to the n digital values, can be provided. The decoder circuit is responsive to the display enable signal for providing one of the n output signals when it receives the corresponding one of the n digital values.

9 Claims, 2 Drawing Sheets

CIRCUIT FOR DRIVING A MULTIPLE-ELEMENT DISPLAY

This is a continuation of application Ser. No. 850,198 filed Apr. 10, 1986 and now abandoned.

This invention relates to a circuit for driving a multiple-element display.

BACKGROUND OF THE INVENTION

It is conventional to use a meter having a deflectable needle to indicate audio signal amplitude. In such a meter, the needle deflection is normally directly proportional to signal amplitude, but the meter scale is usually calibrated in decibels because the perception of loudness is a logarithmic function of signal amplitude. An analog audio meter of this type suffers from the problem that its useful dynamic range is very small compared to the dynamic range of audio signals. The amplitude of a signal that is 20 dB below full scale is one-tenth of full scale amplitude, but audio program material typically has a dynamic range exceeding 60 dB. Consequently, most of that range will barely deflect a linear meter.

Many methods are used to make the indication given by a conventional analog meter more logarithmic, or dB-linear, in order to increase the dynamic range over which the needle is deflected to a readily-perceptible degree, including use of nonlinear meter movements and log-shaping networks.

Electronic bar graph meters employ multiple light-emitting diodes (LEDs). It is conventional to use such bar graph meters to indicate audio signal amplitude, and log-weighted amplitude sensing circuits are used in order to provide a dB-linear display.

SUMMARY OF THE INVENTION

A circuit for driving a display device having n display elements, where n is a positive integer greater than one, comprises a device for providing a repetitive digital signal having a predetermined sequence of n digital values. The digital signal is converted to analog form in accordance with a predetermined transfer function and the resulting analog signal is compared with a second signal. A display enable signal is generated in the event that the magnitude of the analog signal bears a predetermined relationship to the magnitude of the second signal. A decoder circuit has a plurality of output terminals at which n distinct output signals, corresponding respectively to the n digital values, can be provided. The decoder circuit is responsive to the display enable signal for providing one of the n output signals when it receives the corresponding one of the n digital values.

BRIEF DESCRIPTION OF THE DRAWINGS

For the better understanding of the invention, and to show how the same may be carried into effect, reference will now be made, by way of example, to the accompanying drawings in which.

DETAILED DESCRIPTION

Figure 1:
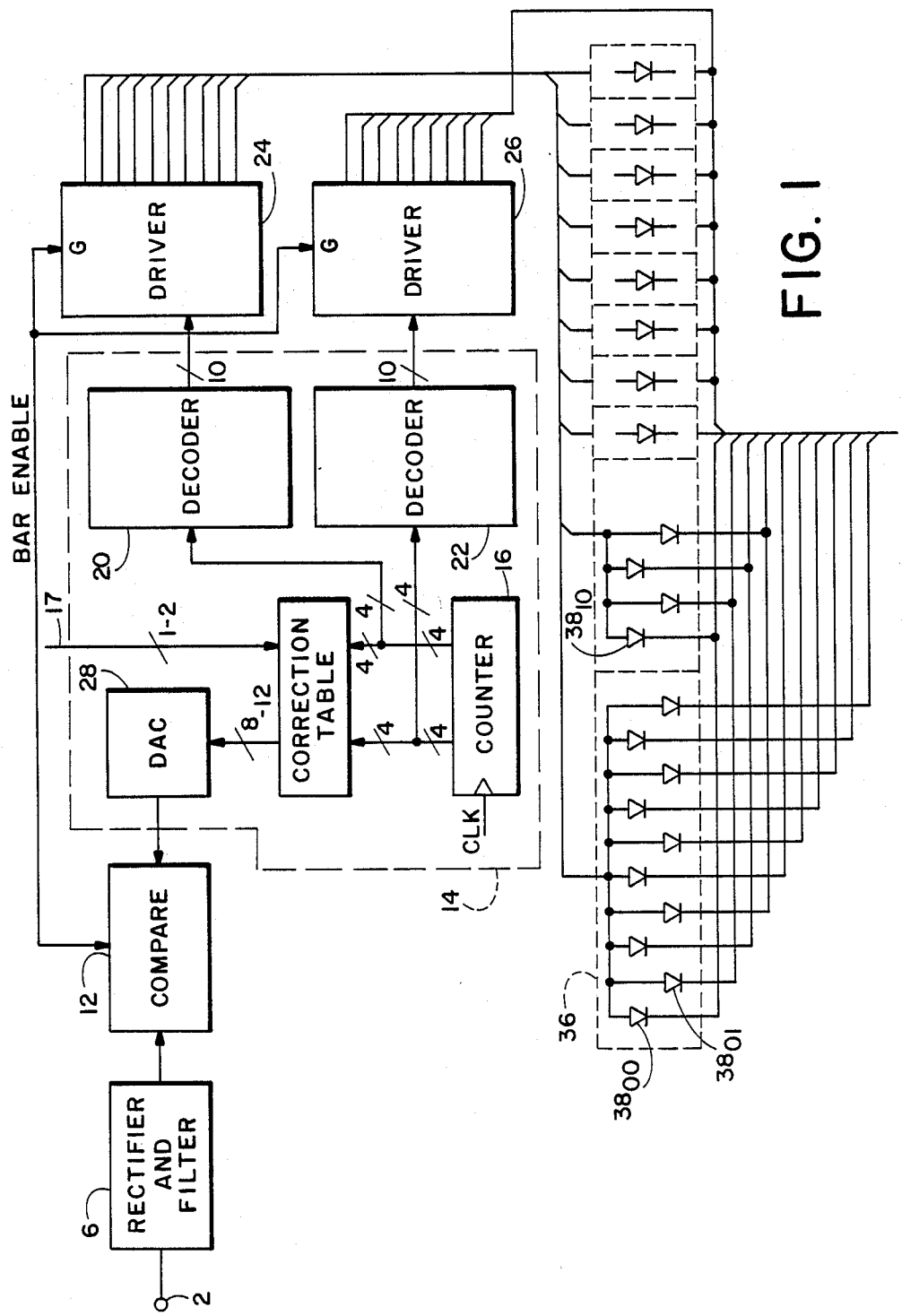
FIG. 1 is a block diagram of an audio level meter embodying the present invention.

The audio level meter shown in FIG. 1 has an input terminal 2 that receives an audio input signal and is connected to a rectifier and filter 6. The nature of the filter determines the characteristic of the audio input signal that is measured by means of the audio level meter. The output signal of the rectifier and filter 6 is applied to a comparator 12, which receives a reference signal from a reference signal generator 14.

Figure 2:
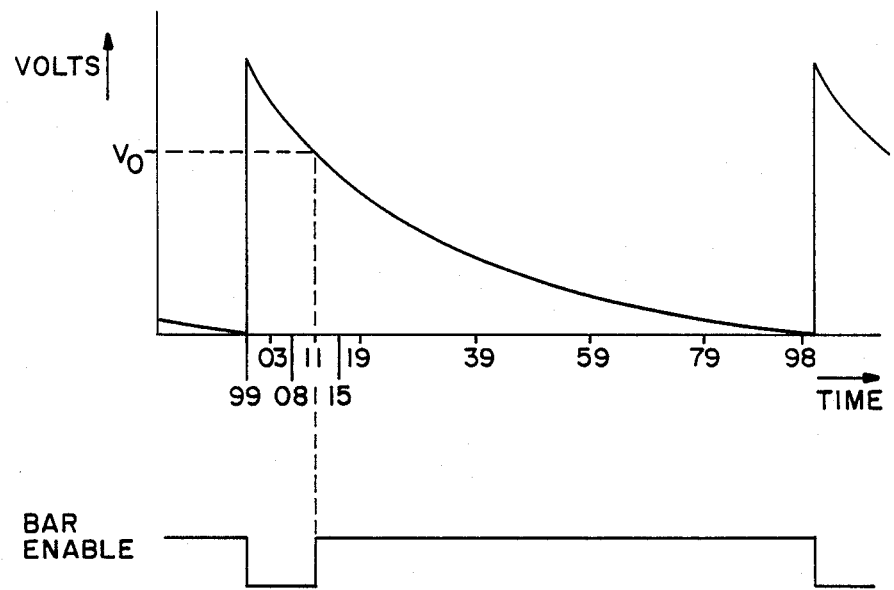
FIG. 2 shows graphs illustrating operation of the FIG. 1 audio level meter.

The reference signal generator 14 comprises a counter 16 which receives a clock signal at its clock input and has two groups of four signal output lines on which it provides a two digit binary coded decimal signal. The BCD signal provided by the counter 16 steps down consecutively through the series of digits representing the decimal numbers 00 through 99. The output lines from the counter 16 are applied to a correction table 18. Also, the higher and lower order groups of lines are applied to respective BCD-to-decimal decoders 20 and 22. The two decoders 20 and 22 each have ten output lines connected to LED drivers 24 and 26. The correction table 18 is a read-only memory (ROM) that contains up to four look-up tables that are separately selectable under control of a signal applied to scale select lines 17 of the ROM. The selected look-up table transforms each of the 100 possible digital input values into a digital word that is applied to a digital-to-analog converter (DAC) 28. The DAC 28 converts the digital output signal provided by the correction table 18 into an analog signal that is applied to the reference terminal of the comparator 12. Therefore, as the clock pulses are received by the counter 16, and the counter steps through its 100 possible states, the analog output signal of the DAC 28 provides a repetitive output signal that depends upon the selected look-up table and the transfer function of the DAC 28. The frequency of the clock signal is about 30 kHz, and therefore the frequency of the analog output signal of the DAC 28 is about 300 Hz. Preferably, the amplitude of the analog output signal decreases as the count decreases from 99 to 00 and increases from its minimum value to its maximum value when the counter resets from the end of its counting sequence (00) to the beginning of the next counting sequence (99), as shown in the top waveform of FIG. 2. The dynamic range of the reference signal voltage corresponds substantially to the dynamic range of the signal voltage applied to the comparator 12 by the rectifier and filter 6. Preferably, the correction table has 12 output lines in order to enable the output signal of the DAC to conform to a desired waveform with a high degree of accuracy.

If the amplitude of the output signal of the DAC 28 is equal to or less than the amplitude of the output signal provided by the rectifier and filter 6, the comparator 12 provides an output signal that is a logical 1. Otherwise, the output signal of the comparator is a logical 0. The output signal of the comparator 12 is applied to the bar enable terminals of the driver circuits 24 and 26.

Each of the drivers 24 and 26 defines ten amplification channels extending between input terminals of the driver and respective output terminals thereof. Each driver is enabled, and thus is able to conduct current between an input terminal and the associated output terminal, if the driver receives a logical 1 at its bar enable terminal G.

The output terminals of the drivers 24 and 26 are connected to a bar graph display 36 comprising a linear array of one hundred LEDs $38_{00}$ to $38_{99}$. The anodes of the diodes $38_{p0}$ to $38_{p9}$ (where p is an integer from 0 to 9) are all connected together and are connected to the pth output terminal of the driver 24. The cathodes of the LEDs $38_{0q}$ to $38_{9q}$ (where q is an integer from 0 to 9) are connected together and are connected to the qth output terminal of the driver 26. The drivers 24 and 26 are enabled only when they receive a logical 1 at their bar enable terminals G. Therefore, the diode $38_{pq}$ receives energizing current only when the state of the counter 16 represents the decimal number pq and the comparator 12 provides a logical 1 at its output terminal. If, for example, the combined transfer function of the correction table 18 and the DAC 28 is such that the output voltage of the DAC 28 follows the upper waveform shown in FIG. 2, and the amplitude of the output signal of the rectifier and filter 6 is $V_o$, as the amplitude of the output signal provided by the DAC 28 falls and becomes equal to $V_o$, the comparator 12 provides a logical 1 at its output terminal and continues to provide a logical 1 until the start of the next repetition of the output signal of the DAC 28, as indicated by the lower waveform in FIG. 2. Consequently, the LED associated with the state of the counter at which the output transition of the comparator 12 occurred, and the LEDs associated with the succeeding states of the counter, are successively energized.

The reference signal generator 14 can be used to control several different audio signal channels, such as left and right signal channels in the case of a stereophonic system, and the transfer function relating detected signal amplitude to the number of energized LEDs is identical for each channel. The transfer function can be readily changed by selecting a different look-up table in the correction table 18 using the scale select lines 17.

It will be appreciated that the present invention is not restricted to the particular circuit that has been described and illustrated, and that variations may be made therein without departing from the scope of the invention as defined in the appended claims and equivalents thereof.

We claim:

1. A circuit for driving a display device having n display elements, where n is a positive integer greater than 1, comprising:
    a device for providing a repetitive digital signal having a predetermined sequence of n digital values,
    conversion means for converting the digital signal to analog form in accordance with a predetermined transfer function,
    comparison means for comparing the magnitude of the analog signal with the magnitude of a second signal and providing a display enable signal in the event that the magnitude of the analog signal bears a predetermined relationship to the magnitude of the second signal, and
    decoder means having a plurality of output terminals at which n distinct output signals, corresponding respectively to said n digital values, are provided, said decoder means being responsive to the display enable signal for providing one of the n output signals to the corresponding one of the n display elements when the decoder means receives the corresponding one of the n digital values.

2. A circuit according to claim 1, wherein the device for providing the repetitive digital signal is a counter having n states, the counter cycling repetitively through the predetermined sequence and having an output at which a binary signal representative of the current state is provided.

3. A circuit according to claim 1, wherein the conversion means comprises a read-only memory correction table responsive to the repetitive digital signal for providing a second repetitive digital signal having a second predetermined sequence of n digital values, and a digital-to-analog converter responsive to the second repetitive digital signal for providing an analog output signal.

4. A circuit according to claim 3, wherein the correction table comprises a plurality of separately selectable look-up tables, the correction table having a scale select input for receiving a signal operative to select one of the separately selectable look-up tables.

5. A circuit according to claim 1, wherein the decoder means has n distinct, separately selectable states associated with said n distinct output signals respectively, and the decoder means is connected to receive the repetitive digital signal and is operative to select a single state element for each of the n digital values of the repetitive digital signal.

6. A circuit according to claim 5, wherein the decoder means comprises an amplifier means connected between the separately selectable states and the display elements.

7. A circuit according to claim 5, wherein the decoder means comprises:
    higher and lower order decoder devices having $m_1$ and $m_2$ output terminals respectively, the product of $m_1$ and $m_2$ being equal to n and being positive integers, and
    first and second amplifiers having $m_1$ and $m_2$ amplification channels respectively, the $m_1$ amplification channels of the first amplifier being connected respectively to the $m_1$ output terminals of the higher order decoder device and the $m_2$ amplification channels of the second amplifier being connected respectively to the $m_2$ output terminals of the lower order decoder device, each display element having two terminals connected between a unique pair of terminals, one terminal being the output of one of the amplification channels of the first amplifier and the other terminal being the output of one of the amplification channels of the second amplifier.

8. A circuit according to claim 7, wherein $m_1$ is equal to $m_2$.

9. A circuit according to claim 1, wherein the comparison means comprises a comparator that provides a signal having a first state in the event that the amplitude of the analog signal is equal to or less than the amplitude of the second signal and otherwise provides a signal having a second state, the first state being the display enable signal.

* * * * *